(12) United States Patent
Kwak

(10) Patent No.: US 7,701,136 B2
(45) Date of Patent: Apr. 20, 2010

(54) ORGANIC LIGHT-EMITTING DISPLAY DEVICE

(75) Inventor: Won Kyu Kwak, Seongnam-si (KR)

(73) Assignee: Samsung Mobile Display Co., Ltd. (KR)

( * ) Notice: Subject to any disclaimer, the term of this patent is extended or adjusted under 35 U.S.C. 154(b) by 807 days.

(21) Appl. No.: 11/514,688

(22) Filed: Aug. 31, 2006

(65) Prior Publication Data
US 2007/0170854 A1 Jul. 26, 2007

(30) Foreign Application Priority Data
Jan. 26, 2006 (KR) .................. 10-2006-0008460

(51) Int. Cl.
*H01J 1/62* (2006.01)
(52) U.S. Cl. ...................... 313/512; 313/498
(58) Field of Classification Search ............. 313/498, 313/503, 504, 505, 506, 512
See application file for complete search history.

(56) References Cited

U.S. PATENT DOCUMENTS

2004/0207314 A1 10/2004 Aitken et al.

FOREIGN PATENT DOCUMENTS

| CN | 1658713 A | 8/2005 |
|---|---|---|
| JP | 07-332964 | 12/1995 |
| JP | 10-074583 | 3/1998 |
| JP | 11-085057 | 3/1999 |
| JP | 2000-036381 | 2/2000 |
| JP | 2002 198186 | 7/2002 |
| JP | 2002-198186 | 7/2002 |
| JP | 2002-359085 | 12/2002 |
| JP | 2005-285631 | 10/2005 |

OTHER PUBLICATIONS

Office Action issued Oct. 24, 2008 to related foreign application CN 2006101714220 with translation.
Office Action issued on Jun. 5, 2009 in the corresponding Chinese Patent Application No. 2006-0171422.

*Primary Examiner*—Vip Patel
(74) *Attorney, Agent, or Firm*—Knobbe Martens Olson & Bear LLP

(57) ABSTRACT

Disclosed is an organic light-emitting display device encapsulated with a frit to prevent an infiltration of oxygen and moisture thereinto.

There is provided an organic light-emitting display device according to the present invention, comprising: a first substrate comprising a pixel region wherein a pixel is formed and a non-pixel region outside of the pixel region; a second substrate opposed and bonded to the first substrate in one region comprising the pixel region; a frit positioned in the non-pixel region between the first substrate and the second substrate, to bond the first substrate and the second substrate; and at least one electrode line formed on the first substrate and overlapped with a portion of the frit, wherein the electrode line comprises at least one opening in an intersecting region overlapped with the frit.

20 Claims, 4 Drawing Sheets

ORGANIC LIGHT-EMITTING DISPLAY DEVICE

CROSS-REFERENCE TO RELATED APPLICATIONS

This application claims the benefit of Korean Patent Application No. 10-2006-0008460, filed on Jan. 26, 2006, in the Korean Intellectual Property Office, the disclosure of which is incorporated herein by reference.

BACKGROUND OF THE INVENTION

1. Field of the Invention

The present invention relates to an organic light-emitting display device. More particularly, the invention relates to an organic light-emitting display device encapsulated with a frit to prevent an infiltration of oxygen and moisture thereinto.

2. Description of the Related Art

In general, an organic light-emitting display device comprises a first substrate comprising a pixel region and a non-pixel region, and a second substrate opposed and disposed to the first substrate and bonded to the first substrate with sealant such as epoxy for encapsulation.

In the pixel region of the first substrate, a plurality of organic light-emitting diodes are formed at intersecting portions of scan lines and data lines in the form of a matrix. Each organic light-emitting diode comprises i) an anode electrode, ii) a cathode electrode and iii) an organic thin film layer. The organic thin film layer may comprise a hole transporting layer, the cathode electrode, a light-emitting layer, and an electron transporting layer. The thin film layer may be formed between the anode electrode and the cathode electrode.

Since the organic light-emitting diode includes organic material, it is vulnerable to degradation in the presence of oxygen. Further, since the cathode electrode is made of a metal material, it may be oxidized by moisture in the air so as to degrade its electrical and light-emitting characteristics. To prevent this, a moisture absorbent material is mounted on a container, e.g., manufactured in the form of a can or cup made of metal material, or on a second substrate of organic, plastic, etc., in the form of powder, or adhered thereto in the form of a film, thereby removing moisture penetrating from the surroundings.

However, the method of mounting the moisture absorbent material in the form of powder can cause problems such as complicating the process, increasing material and process costs, increasing the thickness of a display device, and being difficult to apply to a front light-emitting display configuration. Also, the method of adhering moisture absorbent material in the form of a film can cause problems in that it is limited in its ability to remove moisture and it is difficult to apply to mass production due to low durability and reliability.

Therefore, in order to solve such problems, there has been proposed a method of encapsulating a light-emitting element by forming a sidewall with a frit.

U.S. patent Ser. No. 10/414,794 (Apr. 16, 2003) discloses a glass package encapsulated by adhering a first glass plate and a second glass plate with a frit and method of manufacturing the same.

SUMMARY OF CERTAIN INVENTIVE ASPECTS

One aspect of the present invention provides an organic light-emitting display device capable of preventing an electrode line intersected with a frit from being deformed by laser and improving the adhesion of the electrode line with the frit.

Another aspect of the present invention provides an organic light-emitting display device comprising: i) a first substrate comprising a pixel region wherein a pixel is formed, and a non-pixel region encompassing the pixel region, ii) a second substrate opposed and bonded to the first substrate in a region comprising the pixel region, iii) a frit positioned in the non-pixel region between the first substrate and the second substrate, the frit serving to bond the first substrate and the second substrate, and iv) at least one electrode line formed on the first substrate and overlapped with a portion of the frit, wherein the electrode line comprises at least one opening in an intersecting region overlapped with the frit.

In some embodiments, the electrode line comprises at least one of a scan line, a data line, and a power supply line. In some embodiments, the opening is formed by removing a portion of the electrode line in a predetermined shape. In some embodiments, the opening is formed in the shape of at least one of a quadrangle, a triangle, an inverted triangle, and a circle. In some embodiments, the width of the electrode line in the intersecting region is set to be different from the width thereof in the region outside of the intersecting region.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF CERTAIN INVENTIVE EMBODIMENTS

Figure 1:
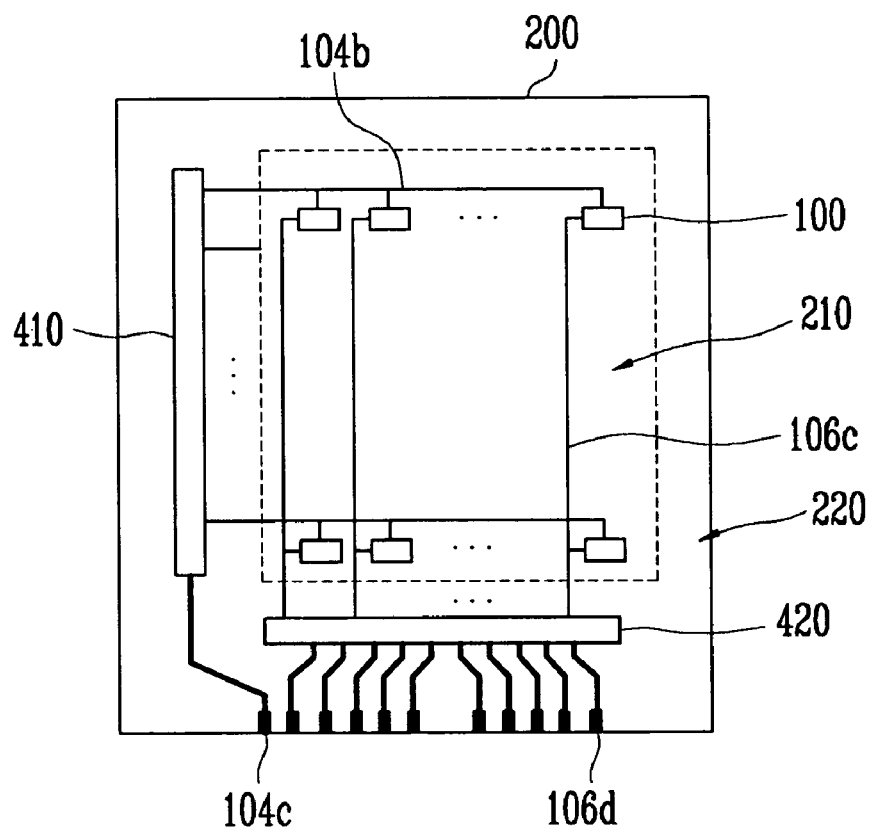
FIG. 1 is a view showing a first substrate of an organic light-emitting display device according to an embodiment of the present invention.

Embodiments of the present invention will be described with reference to the accompanying drawings. Herein, when one element is described as being connected to another element, one element may be not only directly connected to another element but may also be indirectly connected to another element via yet another element. Further, irrelevant elements are omitted for clarity. Also, like reference numerals refer to like elements throughout.

FIG. 1 shows an organic light-emitting display device according to an embodiment of the present invention.

Referring to FIG. 1, a first substrate 200 is comprised of a pixel region 210 and a non-pixel region 220 encompassing the pixel region 210. The pixel region 210 comprises formed scan lines 104b and data lines 106c, and pixels 100 electrically connected to the scan lines 104b and the data lines 106c. The non-pixel region 220 is formed with a scan driver 410 connected with the scan lines 104b and a data driver 420 connected with the data lines 106c. The non-pixel region 220 is formed with a power supplying line (not shown) for supplying power to the pixels 100 and the pads 104c and 106d connected with the external driving circuit (not shown).

Each pixel 100 comprises an organic light-emitting diode (not shown) and at least one thin film transistor for driving the organic light-emitting diode. The organic light-emitting diode is comprised of an anode electrode, a cathode electrode; and an organic thin film layer comprising a hole transporting layer, a light-emitting layer, and an electron transporting layer, which are formed between the anode electrode and the cathode electrode. The thin film transistor comprises a gate electrode, a source electrode and a drain electrode and controls an amount of current supplied to the organic light-emitting diode. One of the pixels 100 is driven when a scan line 104b, connected to the pixel 100, is supplied with scan signals, and data signals are received from the electrically connected data line 106c, so as to generate a predetermined brightness light corresponding to the received data signals.

The scan driver 410 sequentially supplies the scan signals to the scan lines 104b on the basis of control signals supplied from first pads 104c. As a result, the pixels 100 connected with the scan lines 104b are sequentially selected.

The data driver 420 receives data and control signals from second pads 106d. The data driver 420 receiving the data and control signals supplies the data signals to the data lines 106c. Here, the data signals supplied to the data lines 106c are supplied to the pixels 100 selected by the scan signals.

The pads 104c and 106d are electrically connected with the external driving circuit. Here, the first pads 104c are connected with the scan driver 410 to supply the control signal to the scan driver 410, thereby driving the scan driver 410. And, the second pads 106d are electrically connected with the data driver 420 to supply the control signal and data to the data driver 420, thereby driving the data driver 420.

Figure 2A:
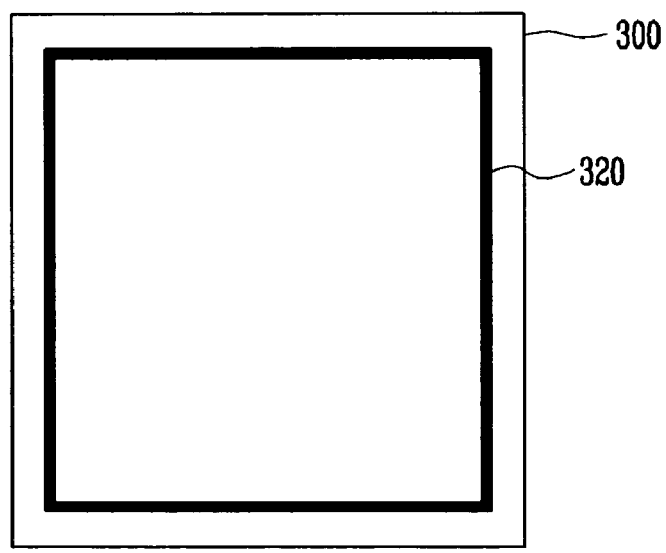
FIG. 2a and FIG. 2b are views showing a second substrate opposed and bonded to the first substrate.
Figure 2B:
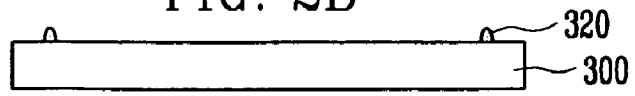

FIGS. 2a and 2b are a plan view and a sectional view of a second substrate bonded to a first substrate. Here, the second substrate (e.g., a sealing substrate 300) is bonded to the first substrate 200 (shown in FIG. 1) so as to prevent moisture from infiltrating into certain internal components of the pixel region 210.

Referring to FIGS. 2a and 2b, the second substrate 300 is provided with a frit 320 in order to bond to the first substrate 200.

A process of producing the frit 320 will be briefly described as follows. In general, the frit in the form of glass powder is produced by rapidly falling temperature in the course of heating glass material at high temperature. When oxide powder is included in the frit in powder form and organic matter is then added to it, a paste in a gel state is produced. The paste is applied to the edge of the second substrate 300 and then heated to a predetermined temperature, such that the organic matter burns and dissipates into the air and the paste in the gel state is cured and attached to the second substrate 300 in a solid state frit 320. Here, the temperature at which the frit 320 burns is about 300° C. to about 500° C. In one aspect, the frit 320 is formed at the height of about 14 to about 15 µm and the width of about 0.6 to about 0.7 mm in order to be able to stably bond the second substrate 300 and the first substrate 200.

After forming the solid state frit 320, the first substrate 200 and the second substrate 300 are bonded together. When bonding the first substrate 200 and the second substrate 300, the pixel region 210 is encapsulated to prevent an infiltration of oxygen and moisture thereinto. To this end, when bonding the second substrate 300 and the first substrate 200, the frit 320 is preferably positioned in the non-pixel region 220. The frit 320 is then irradiated with laser and/or infrared rays from an external source, until it is melted to bond the first substrate 200 and the second substrate 300.

Figure 3:
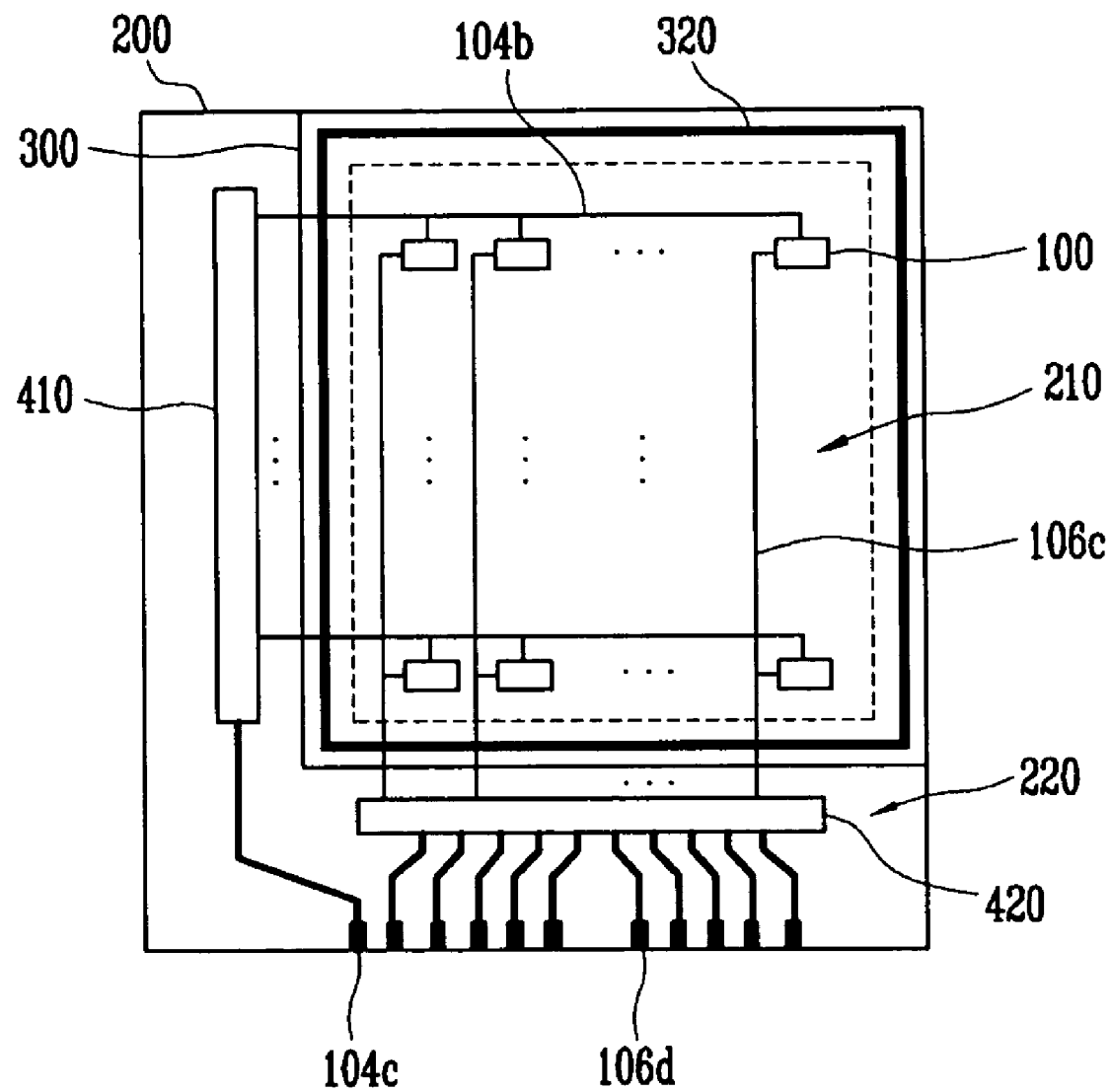
FIG. 3 is a schematic view showing a bonded shape of a second substrate and a first substrate.

FIG. 3 is a schematic view of the second substrate 300 bonded to the first substrate 200. Although FIG. 3 shows the frit 320 positioned inside the scan driver 410, the present invention is not limited thereto. For example, the frit 320 can be positioned outside the scan driver 410 to surround and/or overlap the scan driver 410.

Referring to FIG. 3, the frit 320 is positioned in the non-pixel region 220 to bond the first substrate 200 and the second substrate 300. In some embodiments, the frit 320 is positioned in the non-pixel region 220 and is then irradiated with infrared rays so that the frit 320 is melted and bonded to the first substrate 200, thereby bonding the first substrate 200 and the second substrate 300. After the frit 320 is melted, the first substrate 200 and the second substrate 300 are bonded by the frit 320, thereby preventing oxygen and moisture, etc., from infiltrating into the pixel region 210.

Meanwhile, when bonding the first substrate 200 and the second substrate 300 as in FIG. 3, the frit 320 overlaps with at least one electrode line. For example, the frit 320 may overlap with the scan line 104c, the data line 106c, and the power supply line (not shown). Here, the electrode lines are formed at the time of forming the thin film transistor and/or the organic light-emitting diode, which is included in the pixel 100. The electrode lines can be formed of at least one of a gate metal, a source/drain metal, an anode metal when forming the thin film transistor. For example, the scan line 104b can be formed of the gate metal, the data line and the power supply line can be formed of the source/drain metal. The electrode lines can be formed of the same substance as a semiconductor layer when forming the thin film transistor.

Figure 4:
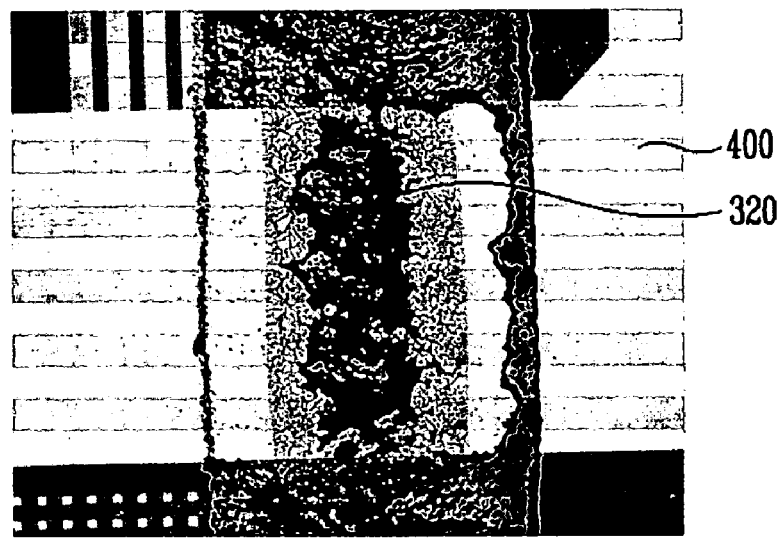
FIG. 4 is a view showing an intersection region of a frit and an electrode line.

Meanwhile, in the intersecting region of the frit 320 and the electrode lines the laser irradiating the frit 320 also irradiates the electrode lines. In this case, the electrode lines positioned at the intersecting region may be heated to a high temperature when irradiated by the laser. The high temperature may result in a deformation of the electrode lines. As shown in FIG. 4, the electrode lines 400 that overlap with the frit 320 in the intersecting region, are cracked by high temperature and their resistance value and electrical characteristics are changed, thereby deteriorating reliability.

Another problem caused by the high temperature is that the adhesion between the electrode lines 400 and the frit 320 is deteriorated. It is estimated that the problem is caused when the laser is supplied to the electrode lines 400 while irradiating the frit 320. The laser is then reflected from the electrode lines 400 and is resupplied to the frit 320, thereby causing the overheating. In this case, the frit 320 rises to a higher temperature than is desired, thereby deteriorating the adhesion characteristics of the frit 320.

Figure 5:
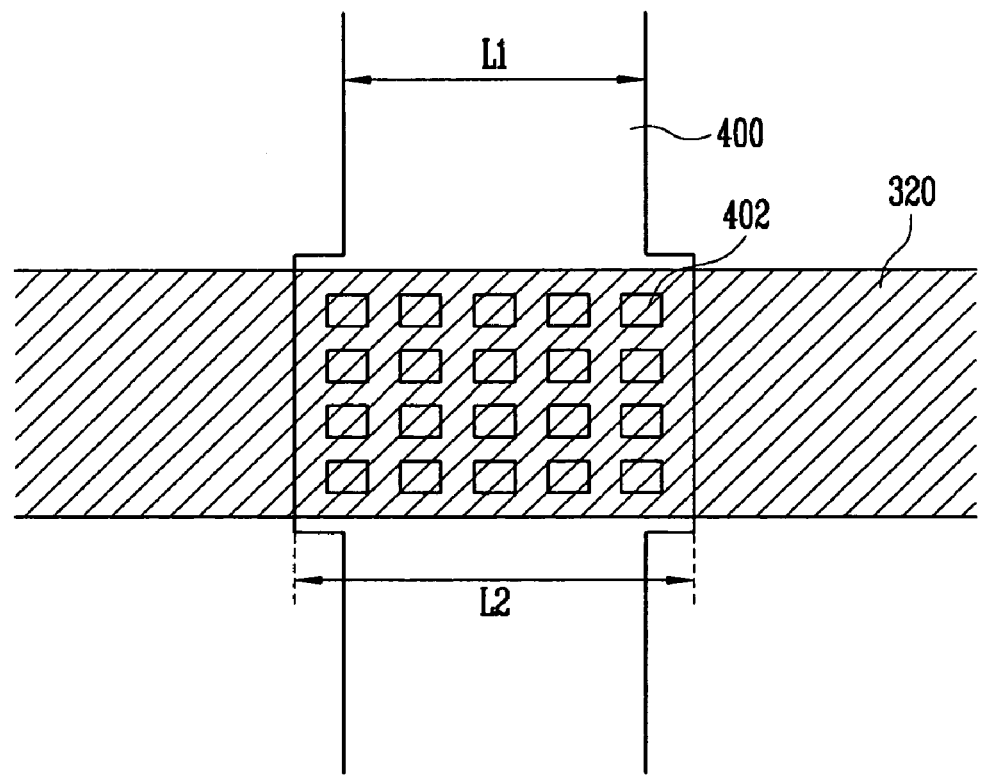
FIG. 5 is a view showing an intersecting region of a frit and an electrode line according to an embodiment of the present invention.

In order to overcome these problems, an aspect of the present invention comprises forming the intersecting region of the frit 320 and the electrode line 400 as shown in FIG. 5.

FIG. 5 shows the interesting region of the frit 320 and the electrode line 400. Referring to FIG. 5, in the intersecting region of the frit 320 and the electrode line 400, the electrode line 400 is formed with at least one opening 402. In the intersecting region, the openings 402 formed in the electrode line 400 allow transmission of the laser supplied to the frit 320, instead of reflecting the laser back onto the frit 320. As a result, the amount of laser, which is directly supplied to the electrode line 400 from the intersecting region, is reduced, thereby preventing the temperature of the electrode line 400 from rapidly rising. In other words, the present invention can prevent the crack of the electrode line 400 in the intersecting region by the openings 402 formed at the electrode line 400.

Also, since the openings 402 transmit the laser, the amount of laser supplied to the frit 320 is also reduced. If the amount of laser resupplied to the frit 320 from the electrode line 400 reduces, the temperature rise of the frit 320 can also be reduced, thereby improving the adhesion between the frit 320 and the electrode line 400.

Meanwhile, due to the openings 402 formed in the electrode line 400 at the intersection region of the frit 320, there is a risk that the resistance value of the electrode line 400 could be reduced below a desired value. To prevent this, the width L2 of the electrode line 400 in the intersecting region is formed wider than the width L1 of the electrode line 400 in the non-intersecting regions.

Figure 6A:
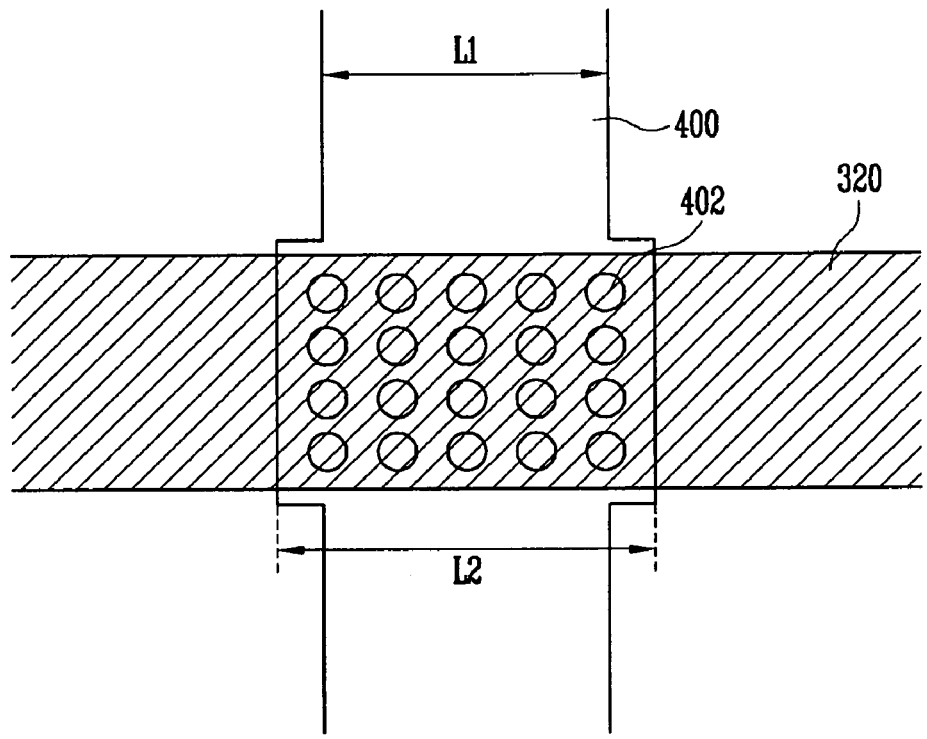
FIG. 6a and FIG. 6b are views showing various embodiments of openings formed in the electrode line.
Figure 6B:
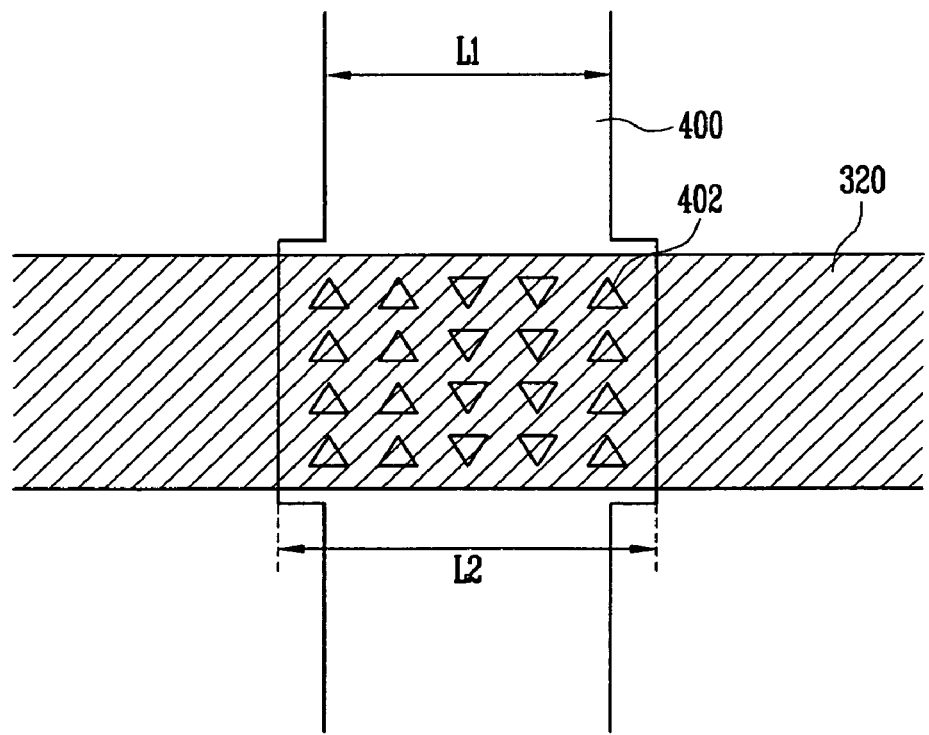

Although FIG. 5 shows a quadrangular shape of the openings 402, the present invention is not limited thereto. For example, the openings 402 can be formed in the shape of a circle, a triangle, or an inverted triangle, etc., as shown in FIGS. 6a and 6b. In fact, in the present invention, the openings 402 can be formed by removing a portion of the electrode line 400, where the shape of the openings 402 can be any shape.

As described above, the organic light-emitting display device forms at least one opening in the electrode lines in the intersecting region of the frit and the electrode lines. If the opening in the electrode line is formed as described above, the amount of laser irradiated to the electrode line is reduced, thereby preventing cracking, etc., from being generated in the electrode line. Also, if the opening is formed at the electrode line, the amount of laser resupplied to the frit from the electrode line is reduced, thereby improving the adhesion between the frit and the electrode line.

Although a few embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An organic light-emitting display device comprising:
   a first substrate comprising a pixel region wherein a pixel is formed, and a non-pixel region outside of the pixel region;
   a second substrate opposed and bonded to the first substrate in a region encompassing the pixel region;
   a frit positioned in the non-pixel region between the first substrate and the second substrate, the frit serving to bond the first substrate and the second substrate; and
   at least one electrode line formed on the first substrate and overlapped with a portion of the frit, wherein the electrode line comprises at least one opening in an intersecting region overlapped with the frit;
   wherein the electrode line is substantially perpendicular to the frit in the intersecting region.

2. The organic light-emitting display device as claimed in claim 1, wherein the electrode line comprises at least one of a scan line, a data line, and a power supply line.

3. The organic light-emitting display device as claimed in claim 1, wherein the frit is melted when it is irradiated with laser or infrared rays to bond the first substrate and the second substrate.

4. The organic light-emitting display device as claimed in claim 1, wherein the opening is formed by removing a portion of the electrode line.

5. The organic light-emitting display device as claimed in claim 4, wherein a shape of the formed opening is at least one of a quadrangle, a triangle, an inverted triangle, and a circle.

6. An organic light-emitting display device comprising:
   a first substrate comprising a pixel region wherein a pixel is formed, and a non-pixel region outside of the pixel region;
   a second substrate opposed and bonded to the first substrate in a region encompassing the pixel region;
   a frit positioned in the non-pixel region between the first substrate and the second substrate, the frit serving to bond the first substrate and the second substrate; and
   at least one electrode line formed on the first substrate and overlapped with a portion of the frit, wherein the electrode line comprises at least one opening in an intersecting region overlapped with the frit;
   wherein a width of the electrode line in the intersecting region is different from a width of the electrode line in a region outside of the intersecting region.

7. The organic light-emitting display device as claimed in claim 6, wherein the width of the electrode line in the intersecting region is wider than the width of the electrode line in the region outside of the intersecting region.

8. The organic light-emitting display device as claimed in claim 1, wherein the pixel comprises at least one thin film transistor and an organic light-emitting diode.

9. The organic light-emitting display device as claimed in claim 8, wherein the electrode line is formed when the thin film transistor or the organic light-emitting diode is formed and formed of a same substance as the thin film transistor or the organic light-emitting diode, wherein the same substance comprises at least one of a gate metal, a source/drain metal, an anode metal, and a semiconductor layer.

10. A method of making an organic light-emitting diode display device according to claim 1, comprising:
    forming one or more of the pixels in the pixel region of the first substrate;
    applying a fit material on the first substrate or on the second substrate;
    forming the one or more electrode lines on the first substrate; and
    bonding the first substrate to the second substrate with the frit.

11. The method of claim 10, wherein the bonding comprises melting the frit by irradiating the frit with laser or infrared radiation.

12. The method of claim 10, further comprising forming the opening in the one or more electrode line by removing a portion of the electrode line.

13. The method of claim 12, wherein a shape of the removed portion of the one or more electrode lines is at least one of a quadrangle, a triangle, and a circle.

14. The method of claim 10, wherein forming the electrode lines comprises forming the one or more electrode lines to have a different width in the intersecting region than in a region outside of the intersecting region.

15. The method of claim 14, wherein the width of the electrode lines in the intersecting region is greater than the width of the electrode lines outside of the intersecting region.

16. The method of claim 10, wherein the frit material comprises an oxide and an organic material, and further wherein the bonding comprises:
    heating the frit material to a temperature sufficient to burn the organic material, thereby dissipating substantially all of the organic material.

17. A display device comprising:
    a first substrate comprising one or more pixels formed on the first substrate;
    a frit positioned around the pixels;
    a second substrate opposed and bonded to the first substrate; and at least one electrode line formed on the first substrate and intersecting a portion of the frit, wherein the electrode line comprises at least one opening in the intersecting portion;

wherein the frit bonds the first substrate and the second substrate;

wherein the electrode line is substantially perpendicular to the frit in the intersecting portion.

18. The display device of claim 17, wherein the frit comprises an oxide material.

19. The display device of claim 17, wherein the width of the electrode line in the intersecting portion is different from the width of the electrode line outside of the intersecting portion.

20. The display device as claimed in claim 19, wherein the width of the electrode line in the intersecting portion is wider than the width of the electrode line in the region outside of the intersecting portion.

* * * * *